(12) United States Patent
Kajino (10) Patent No.: US 11,203,040 B2
(45) Date of Patent: Dec. 21, 2021

(54) PIEZOELECTRIC DRIVING DEVICE, DRIVING METHOD OF PIEZOELECTRIC DRIVING DEVICE, AND ROBOT

(71) Applicant: Seiko Epson Corporation, Tokyo (JP)

(72) Inventor: Kiichi Kajino, Matsumoto (JP)

(73) Assignee: Seiko Epson Corporation

( * ) Notice: Subject to any disclaimer, the term of this patent is extended or adjusted under 35 U.S.C. 154(b) by 723 days.

(21) Appl. No.: 16/047,150

(22) Filed: Jul. 27, 2018

(65) Prior Publication Data

US 2019/0030567 A1    Jan. 31, 2019

(30) Foreign Application Priority Data

Jul. 28, 2017  (JP) ............................. JP2017-146029

(51) Int. Cl.

| | | |
|---|---|---|
| H01L 41/04 | (2006.01) | |
| H02N 2/00 | (2006.01) | |
| B06B 1/02 | (2006.01) | |
| B25J 9/00 | (2006.01) | |
| H01L 41/09 | (2006.01) | |
| H01L 41/187 | (2006.01) | |
| H01L 41/047 | (2006.01) | |
| B25J 9/12 | (2006.01) | |
| H02N 2/14 | (2006.01) | |
| H02N 2/10 | (2006.01) | |

(52) U.S. Cl.

CPC ............ *B06B 1/0284* (2013.01); *B25J 9/0009* (2013.01); *B25J 9/12* (2013.01); *H01L 41/042* (2013.01); *H01L 41/047* (2013.01); *H01L 41/09* (2013.01); *H01L 41/1876* (2013.01); *H02N 2/004* (2013.01); *H02N 2/008* (2013.01); *H02N 2/103* (2013.01); *H02N 2/142* (2013.01)

(58) Field of Classification Search

CPC ... H01L 41/187; H01L 41/0805; H01L 41/09; H01L 41/094; H01L 41/0973
USPC ....................................... 310/323.01–323.21
See application file for complete search history.

(56) References Cited

U.S. PATENT DOCUMENTS

| | | | |
|---|---|---|---|
| 4,743,788 A | 5/1988 | Takagi et al. | |
| 2006/0001330 A1* | 1/2006 | Matsuzaki | H02N 2/101 310/316.01 |
| 2008/0036333 A1* | 2/2008 | Funakubo | H01L 41/0471 310/323.02 |

(Continued)

FOREIGN PATENT DOCUMENTS

| | | |
|---|---|---|
| JP | H04-322179 A | 11/1992 |
| JP | H09-103084 A | 4/1997 |
| JP | 2007-522529 A | 8/2007 |

(Continued)

*Primary Examiner* — Derek J Rosenau
(74) *Attorney, Agent, or Firm* — Harness, Dickey & Pierce, P.L.C.

(57) ABSTRACT

A piezoelectric driving device includes a piezoelectric vibrating body and a driving circuit. The piezoelectric vibrating body includes a contact which comes into contact with a driven member, and a piezoelectric element which generates vibration in accordance with a driving voltage. The driving circuit sets a driving frequency of the driving voltage to a first frequency and starts the driving at the time of initiation from a stopped state, and sets the driving frequency of the driving voltage to a second frequency lower than the first frequency in a driving state after the initiation.

11 Claims, 8 Drawing Sheets

(56) References Cited

U.S. PATENT DOCUMENTS

2012/0248805 A1\* 10/2012 Kamijo ............... B25J 15/0009
                                                            294/213
2012/0316674 A1    12/2012 Urano

FOREIGN PATENT DOCUMENTS

| JP | 2012-253989 A  | 12/2012 |
| JP | 2016-040994 A  | 3/2016  |
| WO | 2005-078509 A2 | 8/2005  |

\* cited by examiner

PIEZOELECTRIC DRIVING DEVICE, DRIVING METHOD OF PIEZOELECTRIC DRIVING DEVICE, AND ROBOT

BACKGROUND

1. Technical Field

The present invention relates to a piezoelectric driving device and various apparatuses, such as a robot provided with the piezoelectric driving device.

2. Related Art

A piezoelectric driving device is an apparatus that uses a piezoelectric element to vibrate a vibrating body and uses the vibration to move a driven member. JP-A-2016-040994 discloses that an elliptical motion is generated in a contact at a tip end of a piezoelectric driving device by using longitudinal vibration and bending vibration, and the driven member is moved by the elliptical motion of the contact. When the driven member is driven in this manner, a state where the contact is in contact with the driven member and a state where the contact is separated from the driven member alternately appear.

However, the inventor of the application has found that there is the following problem when driving the driven member is started. In other words, in a stopped state of the piezoelectric driving device, a contact is in a state of being pressed against a driven member, and the resonance frequency of the piezoelectric driving device in the stopped state is a value significantly different from the resonance frequency in a driving state. In general, the resonance frequency in the stopped state is much higher than the resonance frequency in the driving state. Therefore, when driving the piezoelectric driving device at the resonance frequency in the driving state at the time of initiation, a high driving voltage is required because the contact is unlikely to be separated from the driven member, and once the contact is separated, there is a problem that rapid acceleration occurs since the driving voltage is high. Meanwhile, when driving the piezoelectric driving device at the resonance frequency in the stopped state, a problem that the movement amount of the driven member is small and the operation becomes inefficient, is generated.

SUMMARY

An advantage of some aspects of the invention is to solve at least a part of the problems described above, and the invention can be implemented as the following configurations.

(1) According to one aspect of the invention, a piezoelectric driving device for driving a driven member is provided. The piezoelectric driving device includes a piezoelectric vibrating body and a driving circuit for electrically driving the piezoelectric vibrating body. The piezoelectric vibrating body includes a contact which comes into contact with a driven member, and a piezoelectric element which generates vibration in accordance with a driving voltage supplied from the driving circuit. The driving circuit sets a driving frequency of the driving voltage to a first frequency and starts the driving at the time of initiation from a stopped state, and sets a driving frequency of the driving voltage to a second frequency lower than the first frequency in a driving state after the initiation.

According to the aspect, since the piezoelectric vibrating body is driven at a frequency close to the mechanical resonance frequency both at the time of initiation and in the driving state thereafter, it is possible to drive the driven member with a large force.

(2) In the piezoelectric driving device of the aspect, the first frequency may be closer to the first resonance frequency than to the second resonance frequency, and the second frequency may be closer to the second resonance frequency than to the first resonance frequency.

According to the aspect with this configuration, it is possible to start moving the driven member with a large force at the time of the initiation, and it is possible to prevent the driven member from being driven with an excessively large force in the driving state after the initiation.

(3) In the piezoelectric driving device of the aspect, the piezoelectric vibrating body may be pressed against the driven member by a spring member.

According to the aspect with this configuration, it is possible to easily obtain a configuration in which the first resonance frequency of the piezoelectric vibrating body in the stopped state is higher than the second resonance frequency of the piezoelectric vibrating body in the driving state.

(4) In the piezoelectric driving device of the aspect, the driving circuit may set a value of the driving voltage in the driving state to be lower than a value of the driving voltage in the initiation.

According to the aspect with this configuration, it is possible to start moving the driven member with a large force at the time of the initiation, and it is possible to prevent the driven member from being driven with an excessively large force in the driving state after the initiation.

(5) In the piezoelectric driving device of the aspect, the driving circuit may lower the driving frequency to the second frequency by sweeping down the driving frequency from the first frequency.

According to the aspect with this configuration, since the driving frequency is swept down, it is possible to smoothly shift the operation from the time of the initiation to the driving state.

(6) In the piezoelectric driving device of the aspect, the driving circuit may include a voltage waveform generation circuit for generating a voltage waveform signal having a voltage waveform of the driving voltage, and a voltage amplification circuit for amplifying a voltage of the voltage waveform signal to generate the driving voltage, and the voltage amplification circuit may be configured such that a voltage amplification factor at the first frequency is higher than a voltage amplification factor at the second frequency.

According to the aspect with this configuration, since the voltage amplification factor at the first frequency is higher than the voltage amplification factor at the second frequency, when the driving frequency is lowered to the second frequency by sweeping down the driving frequency from the first frequency, it is possible to smoothly lower the driving voltage.

(7) In the piezoelectric driving device of the aspect, the voltage amplification circuit may have a resonance frequency, and be configured such that the resonance frequency is higher than the first frequency.

According to the aspect with this configuration, since the resonance frequency of the voltage amplification circuit is higher than the first frequency, it is possible to easily obtain the characteristic that the voltage amplification factor at the first frequency is higher than the voltage amplification factor at the second frequency.

The invention can be realized in various aspects, for example, can be realized in various aspects, such as a driving method of a piezoelectric driving device, a robot equipped with a piezoelectric driving device, and the like, in addition to the piezoelectric driving device.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
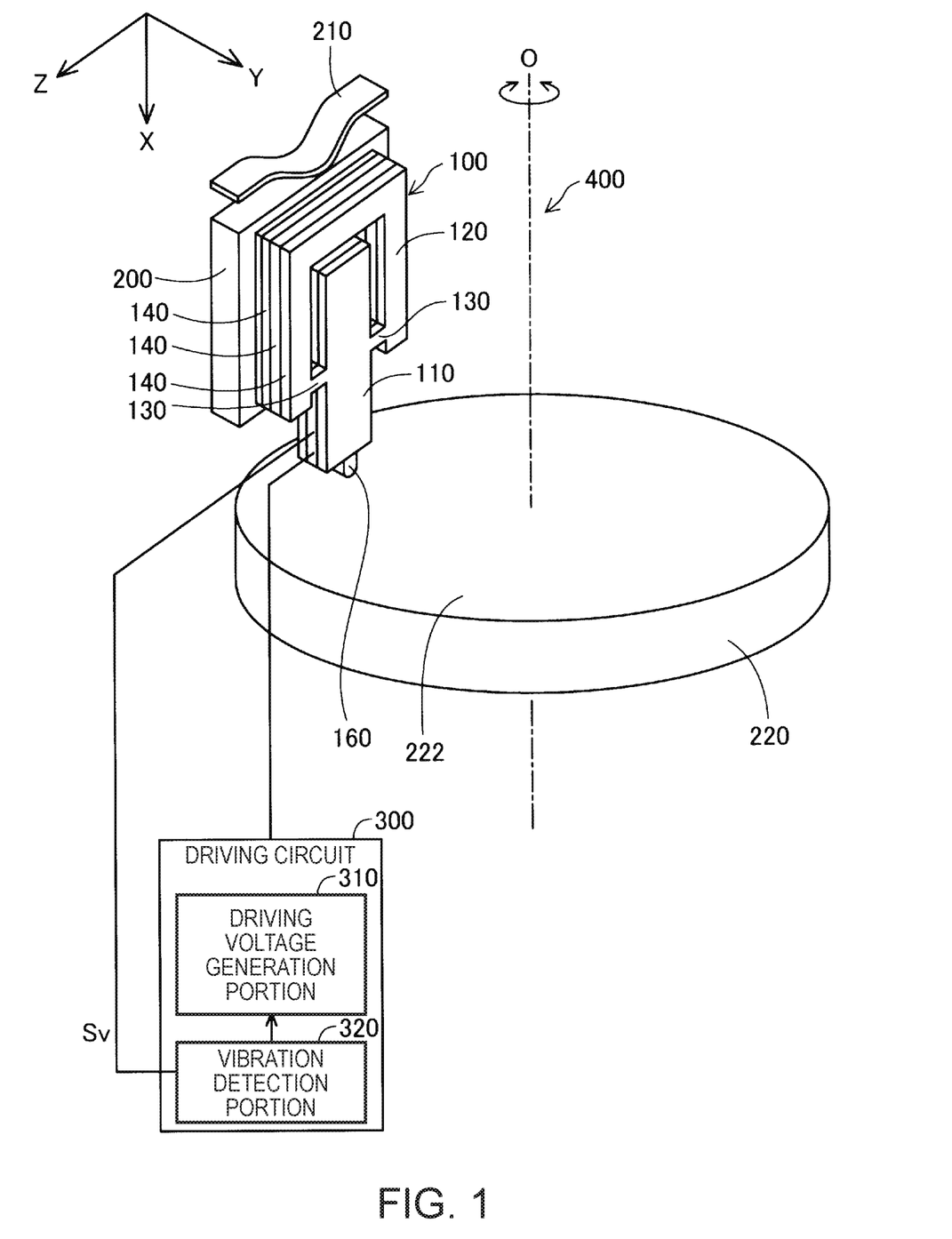
FIG. 1 is a perspective view illustrating a driving mechanism provided with a piezoelectric driving device according to a first embodiment.

FIG. 1 is a perspective view illustrating a driving mechanism provided with a piezoelectric driving device 400 according to a first embodiment. The piezoelectric driving device 400 includes a piezoelectric vibrating body 100 which drives a driven member 220 and a driving circuit 300 which electrically drives the piezoelectric vibrating body 100. In the example, the driven member 220 is a rotor which is rotatable around a rotation axis O. However, as the driven member 220, it is possible to use other types of members, such as linearly movable members. In addition, a plurality of piezoelectric vibrating bodies 100 may be provided for one driven member 220.

The piezoelectric vibrating body 100 includes a vibrating portion 110 capable of vibrating, a supporting portion 120 which supports the vibrating portion 110, and one pair of connecting portions 130 which connect the vibrating portion 110 and the supporting portion 120 to each other. The vibrating portion 110 has a shape of a substantially rectangular plate. At a tip end of the vibrating portion 110, a contact 160 which extends in an X direction from the vibrating portion 110 and comes into contact with the driven member 220 is provided. Here, the phrase "extending in the X direction from the vibrating portion 110" means being provided on the X direction side of the vibrating portion 110. The contact 160 is formed of ceramics having high wear resistance, for example, and adheres to the vibrating portion 110.

The supporting portion 120 of the piezoelectric vibrating body 100 has a U shape that surrounds a base end side (upper end side in FIG. 1) of the vibrating portion 110. Further, the supporting portion 120 is fixed to a stage 200 that serves as a supporting member. The stage 200 is pushed toward the driven member 220 side (lower side in FIG. 1) by a spring member 210. In addition, a structural member that fixes the spring member 210 is not illustrated.

The tip end of the contact 160 comes into contact with a surface 222 of the driven member 220. The piezoelectric vibrating body 100 is pressed toward the driven member 220 side by the spring member 210, and accordingly the contact 160 comes into contact with the surface 222 of the driven member 220 with a sufficient frictional force. Therefore, slipping is suppressed, and the vibration of the vibrating portion 110 can be efficiently transmitted to the driven member 220 via the contact 160.

As a configuration of the piezoelectric vibrating body 100, various configurations other than the configuration illustrated in FIG. 1 can be adopted, and for example, the supporting portion 120 and the connecting portion 130 may be omitted. In addition, in the following description, for convenience of description, the direction in which the vibrating portion 110 and the driven member 220 are arranged (that is, the longitudinal direction of the vibrating portion 110) is referred to as "first direction X", the thickness direction of the piezoelectric vibrating body 100 intersecting with the first direction X (normal direction of a vibration plane) is referred to as "second direction Y", and the width direction of the vibrating portion 110 intersecting the first direction X and the second direction Y is referred to as "third direction Z". Further, a plane defined by the first direction X and the third direction Z is referred to as "XZ plane". The XZ plane is parallel to the surface of the piezoelectric vibrating body 100. It is preferable that the three directions X, Y, and Z are orthogonal to each other.

The piezoelectric vibrating body 100 includes a plurality of piezoelectric vibration modules 140 laminated in the second direction Y. In the example of FIG. 1, the number of piezoelectric vibration modules 140 is three. The plurality of piezoelectric vibration modules 140 are joined by an electrically insulating joining member, such as an adhesive. However, the piezoelectric vibrating body 100 may be configured with one piezoelectric vibration module 140.

The plurality of piezoelectric vibration modules 140 are connected to the driving circuit 300. The driving circuit 300 includes a driving voltage generation portion 310 and a vibration detection portion 320. The driving voltage generation portion 310 has a function of supplying a driving voltage to a piezoelectric element (which will be described later) of the piezoelectric vibrating body 100. The vibration detection portion 320 is connected to a pickup electrode (which will be described later) of the piezoelectric vibrating body 100, and has a function of detecting vibration of the piezoelectric vibrating body 100. The driving voltage generation portion 310 adjusts the frequency of the driving voltage in accordance with a vibration detection signal Sv supplied from the pickup electrode to the vibration detection portion 320, and supplies the driving voltage to the piezoelectric element. An operation of the driving circuit 300 will be further described later.

Figure 2:
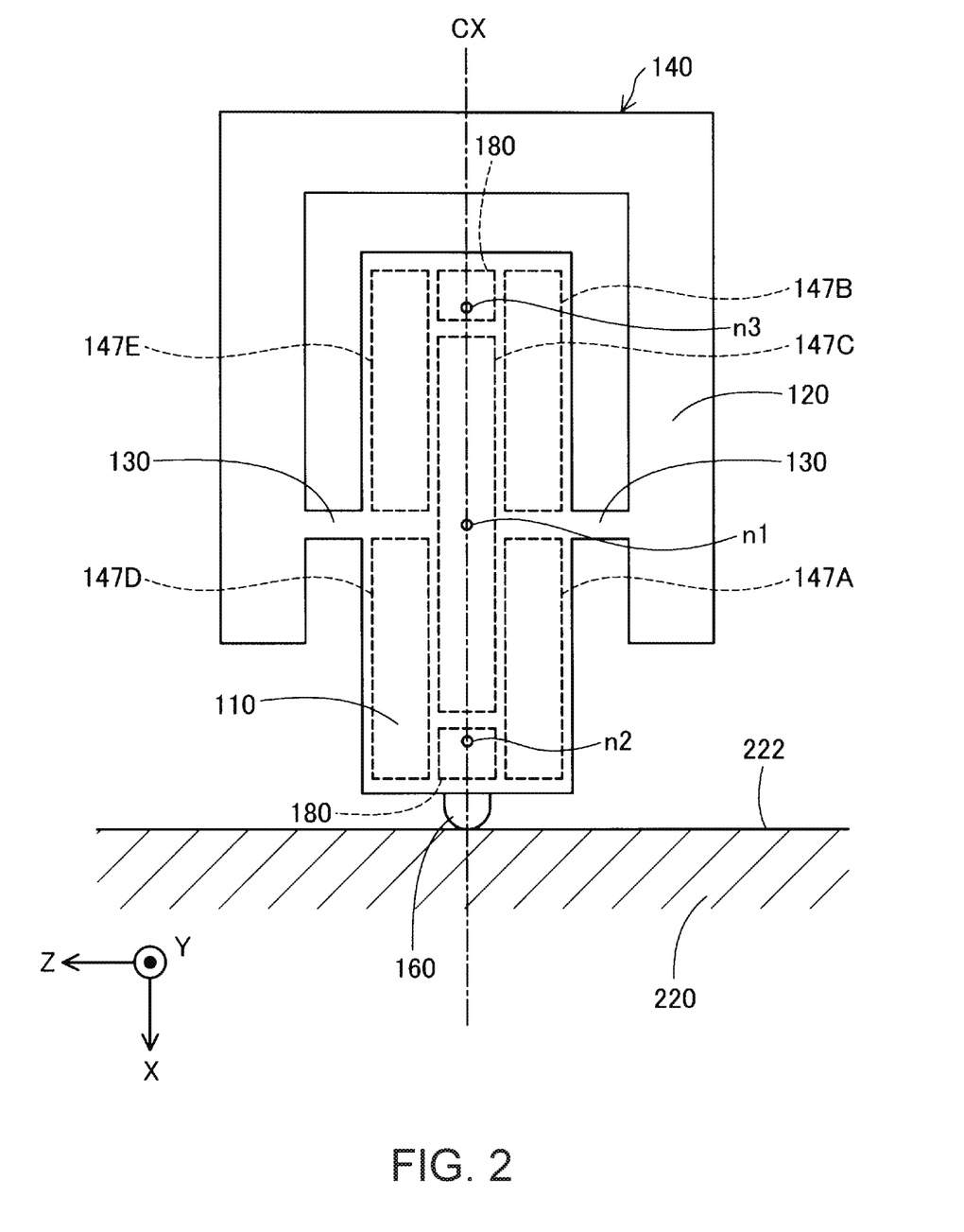
FIG. 2 is a plan view of a piezoelectric vibration module.

FIG. 2 is a plan view illustrating an example of the piezoelectric vibration module 140. The vibrating portion 110 of the piezoelectric vibration module 140 includes five piezoelectric elements 147A to 147E. One pair of piezoelectric elements 147A and 147E on one diagonal line of the rectangular vibrating portion 110 simultaneously expand and contract in the X direction to cause bending vibration in the vibrating portion 110. Another pair of piezoelectric elements 147B and 147D on another diagonal line of the vibrating portion 110 also simultaneously expand and contract in the X direction to cause bending vibration in the vibrating portion 110. However, it is preferable that the expansion and contraction of the pair of piezoelectric elements 147A and 147E and the expansion and contraction of the other pair of piezoelectric elements 147B and 147D are different in phase by 180 degrees. The piezoelectric element 147C at the center in the width direction of the vibrating portion 110 expands and contracts in the X direction and causes longitudinal vibrations along the X direction in the vibrating portion 110.

Each of the piezoelectric elements 147A to 147E has a piezoelectric body (not illustrated) and two electrodes (not illustrated) sandwiching both surfaces of the piezoelectric body. As a configuration material of the piezoelectric body, piezoelectric ceramics, such as lead titanate zirconate (PZT), barium titanate, lead titanate, potassium niobate, lithium niobate, lithium tantalate, sodium tungstate, zinc oxide, barium strontium titanate (BST), strontium bismuth tantalate (SBT), lead metaniobate, lead scandium niobate lead, or the like, can be used. The piezoelectric body configured of piezoelectric ceramics may be formed from, for example, a bulk material, or may be formed by using a sol-gel method or a sputtering method. In addition, as a configuration material of the piezoelectric body, in addition to the above-described piezoelectric ceramics, polyvinylidene fluoride, quartz, or the like may be used.

The piezoelectric vibration module 140 further includes two pickup electrodes 180. The pickup electrode 180 is an electrode for detecting the vibration of the piezoelectric vibrating body 100 and supplying a vibration detection signal Sv (FIG. 1) to the driving circuit 300. In the example of FIG. 2, the pickup electrode 180 is provided on the upper side and on the lower side of the piezoelectric element 147C at the center of the vibrating portion 110. However, only one pickup electrode 180 may be provided, and the pickup electrode 180 may be omitted.

Figure 3:
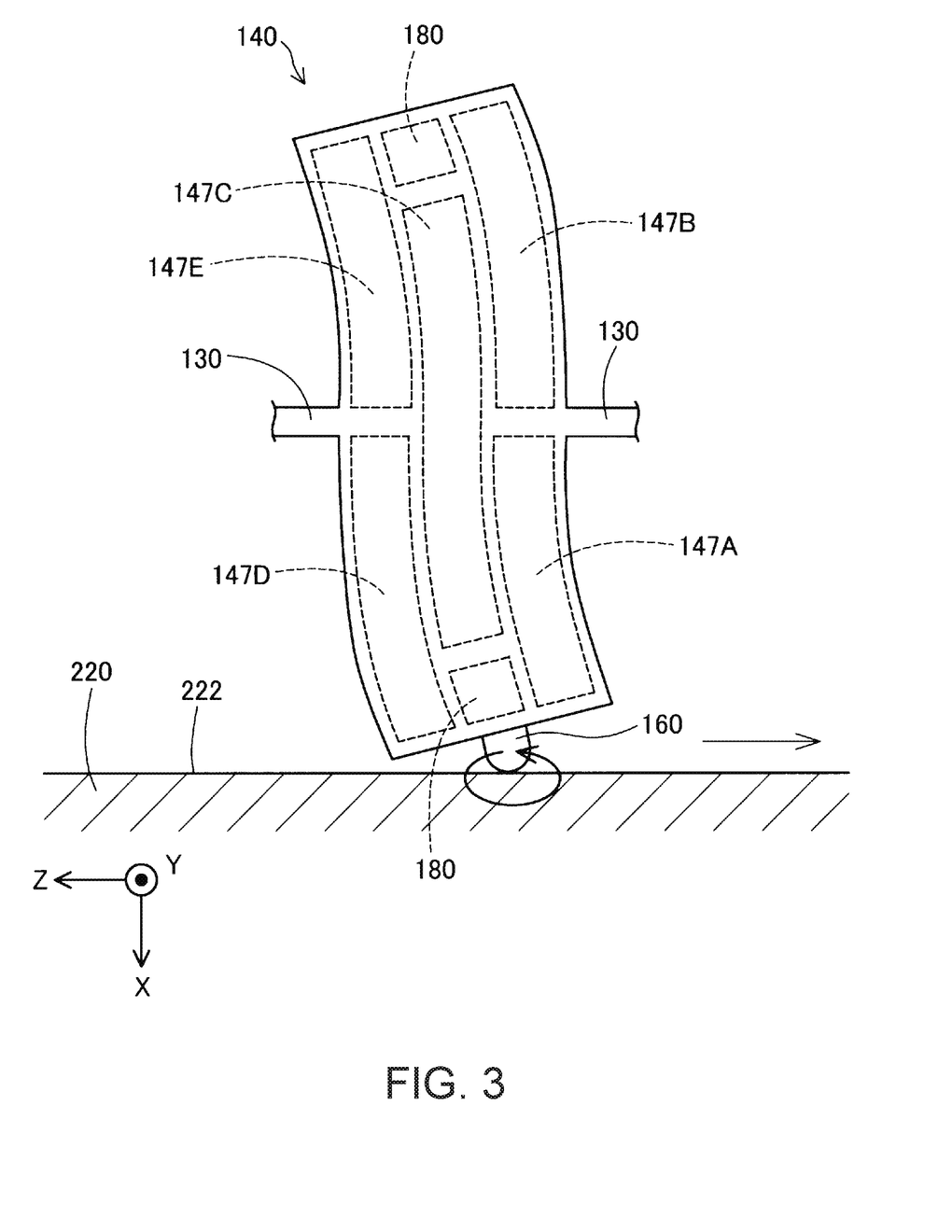
FIG. 3 is a view illustrating a state of vibration of the piezoelectric vibration module.

FIG. 3 is a schematic view illustrating a state of vibration of the piezoelectric vibration module 140. The piezoelectric vibration module 140 can vibrate such that the contact 160 elliptically moves. The elliptical motion is realized by generating the bending vibration by expansion and contraction of the pair of piezoelectric elements 147A and 147E and expansion and contraction of the other pair of piezoelectric elements 147B and 147D, and by generating the longitudinal vibration by expansion and contraction of the piezoelectric element 147C at the center. "Bending vibration" is a vibration in which the piezoelectric vibration module 140 bends in an S shape as illustrated in FIG. 3 in the plane of the piezoelectric vibration module 140. "Longitudinal vibration" is a vibration that expands and contracts along the longitudinal direction (first direction X) of the piezoelectric vibration module 140. The entire piezoelectric vibrating body 100 also vibrates similar to the piezoelectric vibration module 140. The four piezoelectric elements 147A, 147B, 147D, and 147E generate the bending vibration and are also referred to as "first piezoelectric element". The piezoelectric element 147C generates the longitudinal vibration and is also referred to as "second piezoelectric element". The number of the first piezoelectric elements 147A, 147B, 147D, and 147E or the second piezoelectric element 147C is an example, and the number of the first piezoelectric elements and the number of the second piezoelectric elements can be appropriately set to other values. For example, the pair of first piezoelectric elements 147A and 147B may be omitted, and the bending vibration may be generated by the other pair of first piezoelectric elements 147D and 147E.

Figure 4:
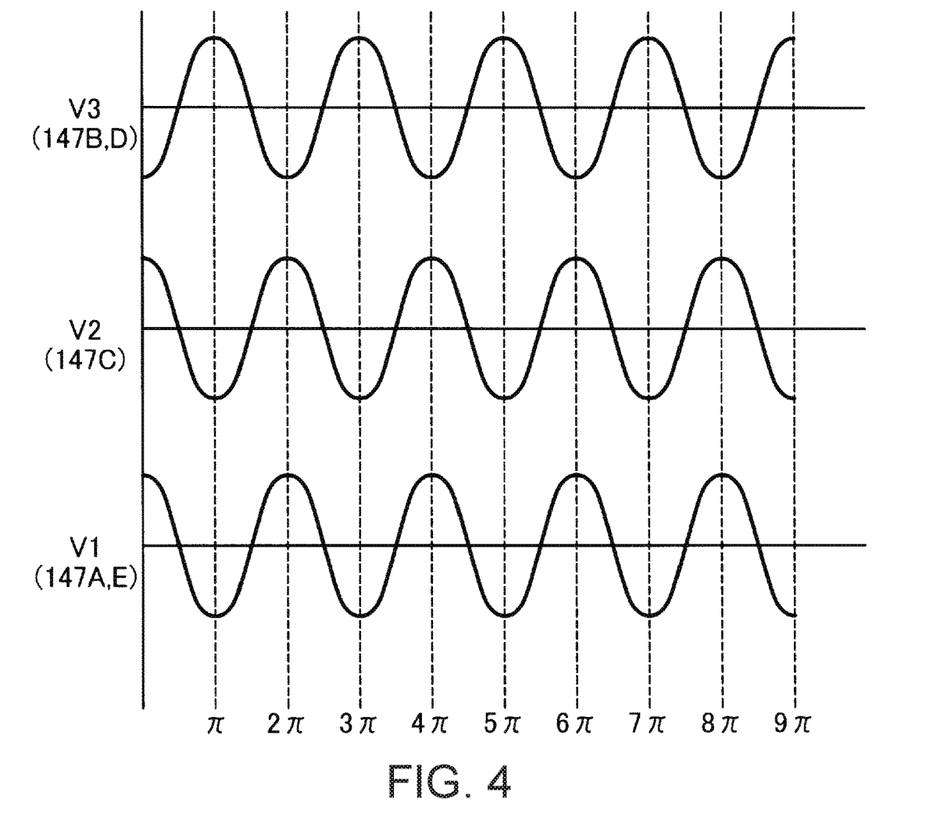
FIG. 4 is a view illustrating an example of a driving voltage waveform of the piezoelectric vibration module.

FIG. 4 illustrates an example of a waveform of the driving voltage supplied to the piezoelectric elements 147A to 147E. A driving voltage V1 is applied to the pair of piezoelectric elements 147A and 147E, a driving voltage V2 is applied to the piezoelectric element 147C, and a driving voltage V3 is applied to the other pair of piezoelectric elements 147B and 147D. In addition, the driving voltage V3 is obtained by changing the phase by $\pi(=180°)$ from the driving voltage V1, and is substantially equivalent to the driving voltage V1. The driving voltages V1 and V3 are driving voltages for generating the bending vibration in the piezoelectric vibration module 140 and are referred to as "first driving voltage". The driving voltage V2 is a driving voltage for generating the longitudinal vibration in the piezoelectric vibration module 140 and is also referred to as "second driving voltage". In addition, the frequencies of the first driving voltages V1 and V3 and the frequency of the second driving voltage V2 are normally set equal to each other.

The piezoelectric vibration module 140 vibrates such that the contact 160 performs elliptical motion by combining the bending vibration and the longitudinal vibration to each other (FIG. 3). In this manner, by causing the pair of piezoelectric elements 147A and 147E, the other pair of piezoelectric elements 147B and 147D, and the piezoelectric element 147C to expand and contract at different phases, the contact 160 can be vibrated along the elliptic orbit. However, when the contact 160 can be vibrated along the elliptical orbit, various waveforms other than those illustrated in FIG. 4 can be used as the waveform of the driving voltage of the piezoelectric vibration module 140. For example, the driving voltage may include a DC component in addition to an AC component. In this case, "frequency of driving voltage" means the frequency of the AC component.

As illustrated in FIG. 2, it is preferable that the pickup electrode 180 is disposed at a position on a center axis CX of the piezoelectric vibrating body 100 that extends along the first direction X in a plan view. The center axis CX is positioned to match the center axis of the vibrating portion 110 in a plan view. When placing the pickup electrode 180 at the position on the center axis CX of the piezoelectric vibrating body 100, the influence of the bending vibration decreases, and there is an advantage that it is easy to accurately detect the longitudinal vibration. It is preferable that the pickup electrode 180 is further disposed at any position of nodes n1, n2, and n3 of the bending vibration. In the example of FIG. 2, the node n1 of the bending vibration exists at the center of the vibrating portion 110 and the other two nodes n2 and n3 exist at the position in the vicinity of the end portion of the vibrating portion 110 on the center axis CX. By arranging the pickup electrode 180 at any position of the nodes n1, n2, and n3 of the bending vibration, it is possible to further reduce the influence of the bending vibration, and thus, there is an advantage that the longitudinal vibration of the piezoelectric vibrating body 100 can be more easily detected. However, the pickup electrodes 180 may be disposed at other positions.

Figure 5:
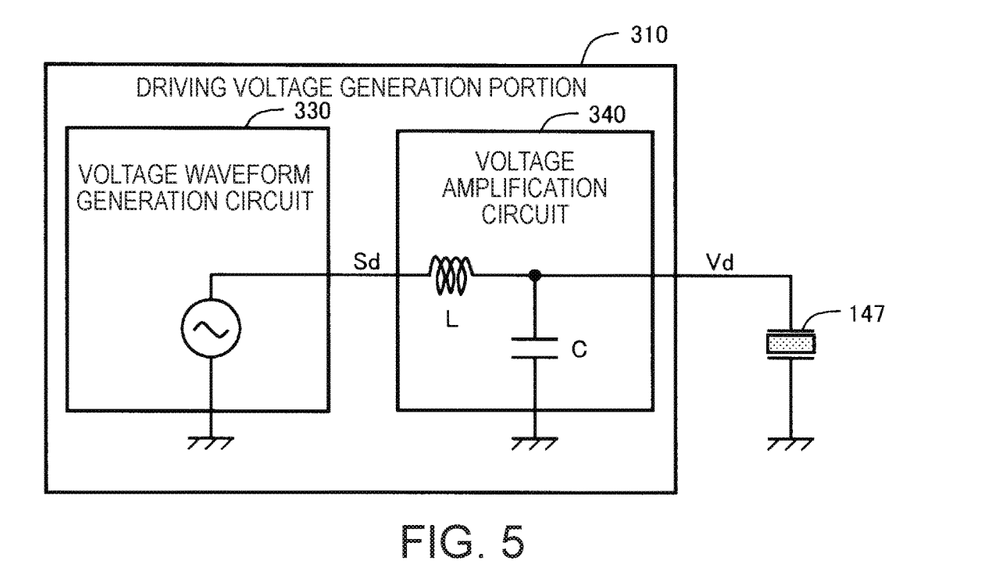
FIG. 5 is a block diagram illustrating an example of a configuration of a driving voltage generation portion.

FIG. 5 is a block diagram illustrating an example of a configuration of the driving voltage generation portion 310. The driving voltage generation portion 310 includes a voltage waveform generation circuit 330 for generating a voltage waveform signal Sd having a voltage waveform of a driving voltage Vd, and a voltage amplification circuit 340 for amplifying the voltage of a voltage waveform signal Sd to generate the driving voltage Vd. The driving voltage Vd is supplied to the piezoelectric element 147 to drive the piezoelectric element 147. In the example of FIG. 5, the voltage amplification circuit 340 is configured with a resonance circuit (more specifically, an LC series resonance circuit). However, the voltage amplification circuit 340 may be any circuit as long as it is possible to amplify the voltage of the voltage waveform signal Sd, and circuits having other various configurations can be adopted. For example, the voltage amplification circuit 340 may be configured using an operational amplifier.

The driving voltage Vd generated by the driving voltage generation portion 310 corresponds to any of the three driving voltages V1 to V3 illustrated in FIG. 4. The driving circuit 300 may have three driving voltage generation portions 310 illustrated in FIG. 5 in order to generate the driving voltages V1 to V3. Otherwise, the driving circuit 300 may generate the driving voltages V1 to V3 illustrated in FIG. 4 by using a phase adjusting circuit for adjusting the phase of the driving voltage Vd generated by the driving voltage generation portion 310 illustrated in FIG. 5. Hereinafter, the operation of the piezoelectric driving device 400 will be described using the driving voltage Vd generated by the driving voltage generation portion 310 as a representative example of the driving voltages V1 to V3 of FIG. 4.

Figure 6:
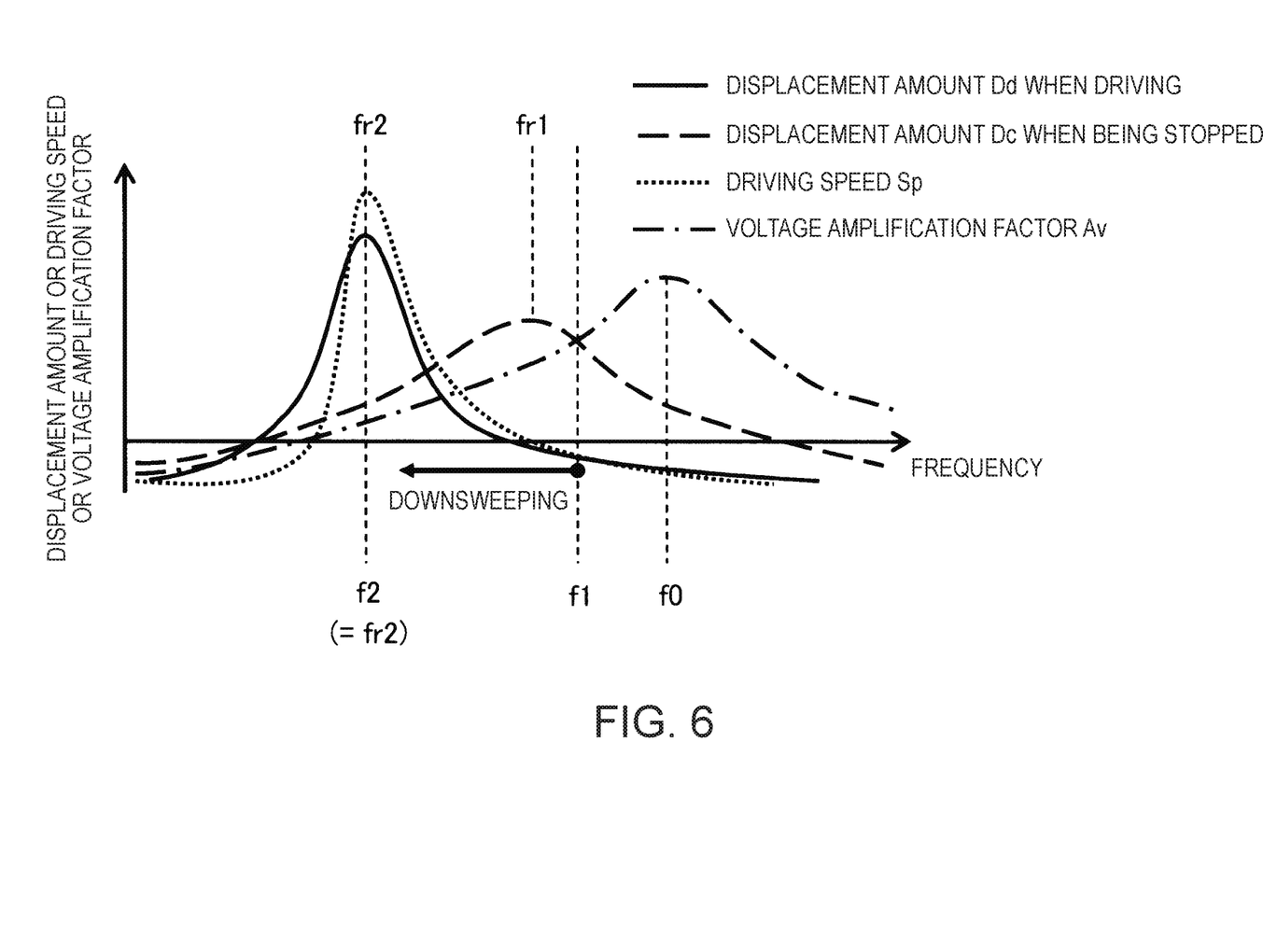
FIG. 6 is a graph illustrating operation characteristics in an embodiment.

FIG. 6 is a graph illustrating operation characteristics in the first embodiment. The horizontal axis is the frequency of the driving voltage Vd (FIG. 5). The broken line indicates a displacement amount Dc of the piezoelectric vibrating body 100 in the stopped state. The displacement amount Dc in the stopped state is the largest at a resonance frequency fr1 (first resonance frequency) of the piezoelectric vibrating body 100 in the stopped state. The solid line indicates a displacement amount Dd of the piezoelectric vibrating body 100 in the driving state. The displacement amount Dd in the driving state is the largest at a resonance frequency fr2 (second resonance frequency) of the piezoelectric vibrating body 100 in the driving state. The dotted line indicates a driving speed Sp. The driving speed Sp means a speed at which the driven member 220 is driven. The driving speed Sp is highest at the resonance frequency fr2 in the driving state.

As illustrated in FIG. 6, the piezoelectric vibrating body 100 is configured such that the resonance frequency fr1 in the stopped state is higher than the resonance frequency fr2 in the driving state. As described in FIG. 1, since the piezoelectric vibrating body 100 is pressed against the driven member 220 by the spring member 210, in the stopped state, the contact 160 is in a state of being pressed against the driven member 220. In this case, it is usual that the resonance frequency fr1 in the stopped state is higher than the resonance frequency fr2 in the driving state. However, it is also possible to obtain the same effect by using means other than the spring member 210. In addition, in the embodiment, it is assumed that the resonance frequency of the longitudinal vibration of the piezoelectric vibrating body 100 is equal to the resonance frequency of the bending vibration. When both of the longitudinal vibration and the bending vibration are different from each other, the resonance frequencies fr1 and fr2 illustrated in FIG. 6 are defined by the resonance frequency of the longitudinal vibration.

When initiating from the stopped state, the driving circuit 300 sets the driving frequency of the driving voltage Vd to a first frequency f1 closer to the resonance frequency fr1 in the stopped state than to the resonance frequency fr2 during driving, and starts the driving. The driving circuit 300 sets the driving frequency of the driving voltage Vd to a second frequency f2 that is a frequency lower than the first frequency f1 and closer to the resonance frequency fr2 in the driving state than to the resonance frequency fr1 in the stopped state in the driving state after the initiation. In this manner, since the piezoelectric vibrating body 100 is driven at a frequency close to the mechanical resonance frequency both at the time of initiation and in the driving state, it is possible to drive the driven member 220 with a large force.

In addition, the driving frequency appropriate for driving the piezoelectric element 147 changes depending on the situation, such as an aspect of the driven member 220 or environmental temperature. In order to generate a high driving force in the piezoelectric driving device 400, it is desirable to perform driving control so as to follow the driving frequency appropriate for the situations. To this end, it is preferable that the driving frequency is lowered to the frequency f2 in the driving state by sweeping down the driving frequency from the frequency f1 at the time of the initiation. In this manner, it is possible to appropriately set an appropriate driving frequency that corresponds to various situations. In addition, it is possible to smoothly shift the operation from the time of the initiation to the driving state.

The one-dot chain line in FIG. 6 indicates a voltage amplification factor Av of the voltage amplification circuit 340 (FIG. 5). The voltage amplification factor Av has the maximum peak at a frequency f0 and decreases as being separated from the frequency f0. In a case where the voltage amplification circuit 340 is configured as a resonance circuit, the frequency f0 is equal to the resonance frequency of the voltage amplification circuit 340. For example, in a case where the voltage amplification circuit 340 is configured with an LC resonance circuit, the resonance frequency f0 is $1/\{2\pi\sqrt{(LC)}\}$.

As described above, the piezoelectric element 147 is driven at the first frequency f1 at the time of the initiation, and is driven at the second frequency f2 in the subsequent driving state. The voltage amplification factor Av at the second frequency f2 in the driving state is set to be lower than the voltage amplification factor Av at the first frequency f1 at the time of the initiation. In other words, the voltage amplification factor Av at the first frequency f1 is higher than the voltage amplification factor Av at the second frequency f2. When utilizing the characteristics, it is possible to start moving the driven member with a large force at the time of the initiation, and it is possible to prevent the driven member 220 from being driven with an excessively large force in the driving state after the initiation.

In addition, in the present embodiment, the voltage amplification circuit 340 is configured as a circuit having the resonance frequency f0 higher than the first frequency f1, and with the circuit configuration, characteristics that the voltage amplification factor Av at the second frequency f2 in the driving state is lower than the voltage amplification factor Av at the first frequency f1 at the time of the initiation are realized. However, preferable characteristics of the voltage amplification factor Av at the two frequencies f1 and f2 may be realized by using other circuit configurations. Meanwhile, when the voltage amplification circuit 340 is configured to have the resonance frequency f0 higher than the driving frequency f1 at the time of the initiation, when the driving frequency is lowered to the second frequency f2 by sweeping down the driving frequency from the first frequency f1, there is an advantage that the driving voltage Vd can be smoothly lowered.

In addition, it is preferable that the value of the preferable driving frequency in the driving state is determined in accordance with the vibration detection signal Sv (FIG. 1) supplied from the pickup electrode 180 to the driving circuit 300. For example, in the driving state after the initiation, the frequency of the driving voltage Vd can be adjusted such that the phase difference between the driving voltage Vd supplied to the piezoelectric element 147 and the vibration detection signal Sv detected by the pickup electrode 180 becomes a predetermined preferable value. Otherwise, the frequency of the driving voltage Vd may be adjusted such that the amplitude of the vibration detection signal Sv becomes sufficiently large.

As described above, in the piezoelectric driving device 400 of the first embodiment, the piezoelectric vibrating body 100 is configured such that the resonance frequency fr1 in the stopped state is higher than the second resonance frequency in the driving state. In addition, when initiating from the stopped state, the driving circuit 300 sets the driving frequency of the driving voltage Vd to the first frequency f1 closer to the resonance frequency fr1 in the stopped state than to the resonance frequency fr2 in the driving state and starts the driving, and the driving circuit 300 sets the driving frequency of the driving voltage Vd to the second frequency f2 closer to the resonance frequency fr2 in the driving state than to the resonance frequency fr1 in the stopped state in the driving state after the initiation. As a result, since the piezoelectric vibrating body 100 is driven at a frequency close to the mechanical resonance frequencies fr1 and fr2 both at the time of initiation and in the driving state, it is possible to drive the driven member 220 with a large force.

OTHER EMBODIMENTS

Figure 7:
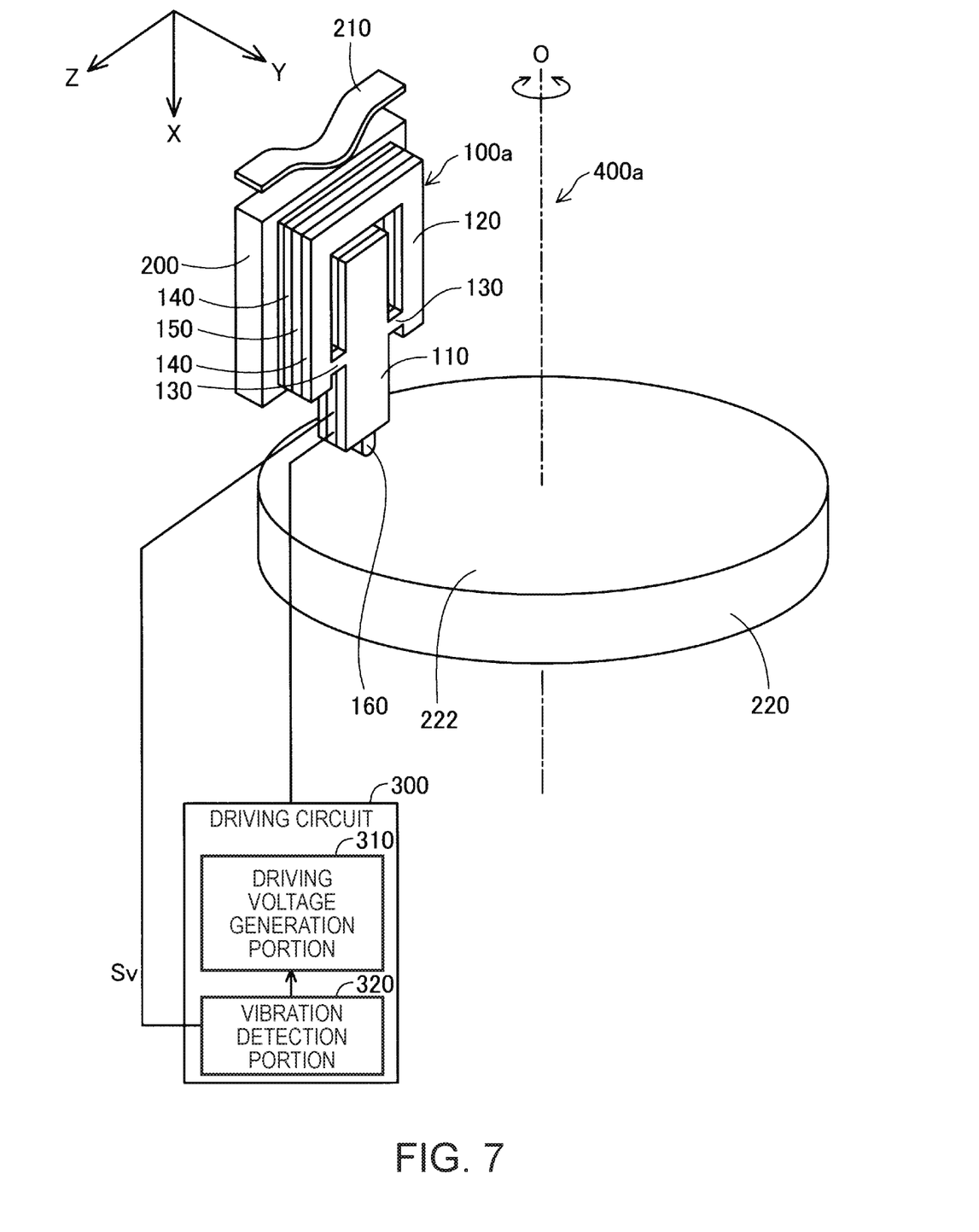
FIG. 7 is a perspective view illustrating a driving mechanism provided with a piezoelectric driving device according to a second embodiment.

FIG. 7 is a perspective view illustrating a driving mechanism provided with a piezoelectric driving device 400a according to a second embodiment. The piezoelectric driving device 400a is different from the first embodiment in that a second piezoelectric vibration module 150 is disposed between the plurality of piezoelectric vibration modules 140, and other configurations are the same as those of the first embodiment. In other words, in the above-described FIG. 1, the three piezoelectric vibration modules 140 are laminated in the second direction Y, but in the second embodiment illustrated in FIG. 7, between the two first piezoelectric vibration modules 140, the second piezoelectric vibration module 150 having a structure different from that of the piezoelectric vibration module 140 is disposed.

Figure 8:
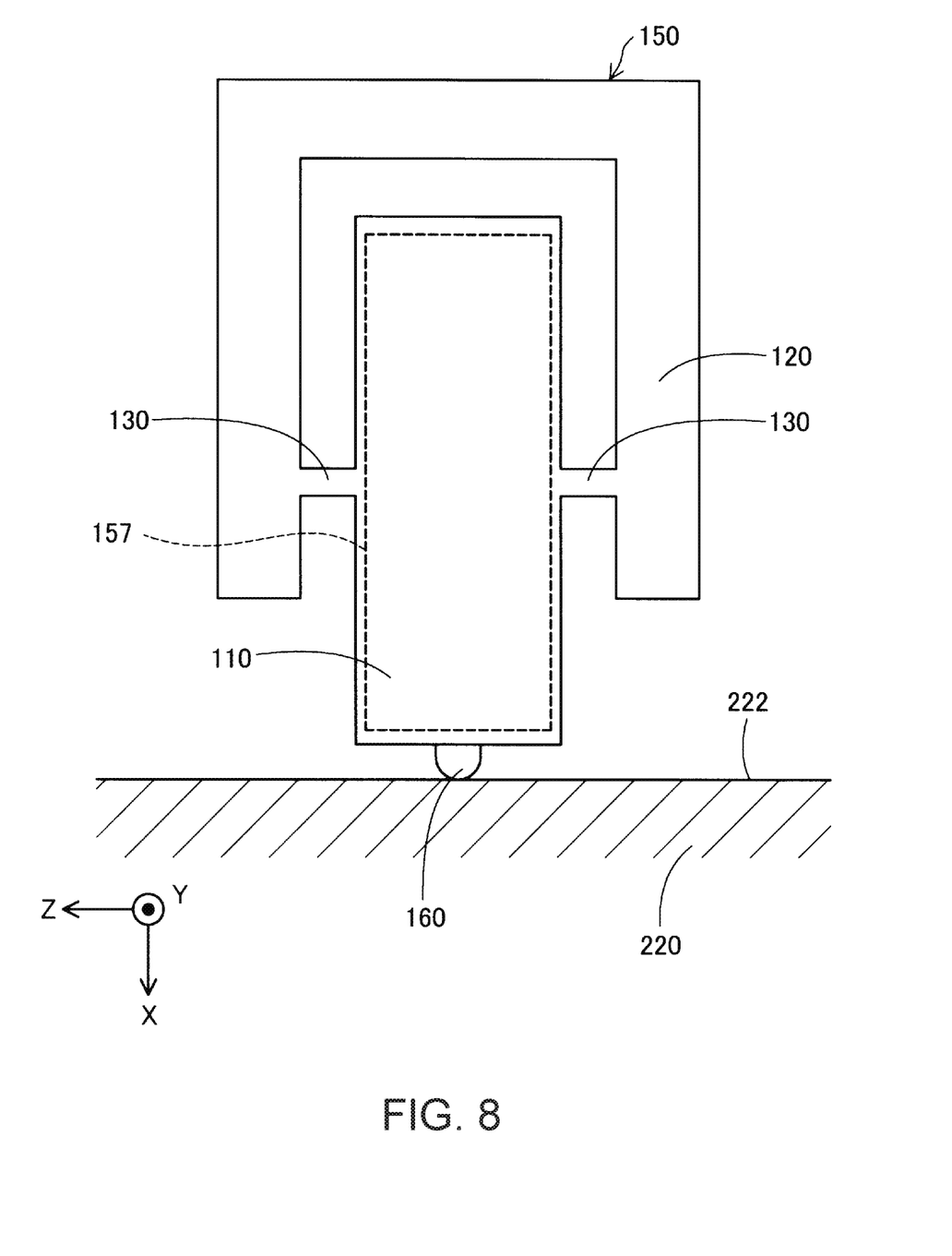
FIG. 8 is a plan view of a second piezoelectric vibration module of the second embodiment.

FIG. 8 is a plan view of the second piezoelectric vibration module 150 of the second embodiment. The second piezoelectric vibration module 150 has one piezoelectric element 157 disposed so as to widen over substantially the entire region of the vibrating portion 110 thereof. Similar to the piezoelectric element 147C (FIG. 2) disposed at the center of the first piezoelectric vibration module 140, the piezoelectric element 157 generates the longitudinal vibration and corresponds to "second piezoelectric element". Therefore, the same driving voltage as the driving voltage V2 (FIG. 4) supplied to the piezoelectric element 147C may be supplied to the piezoelectric element 157. In addition, in the second embodiment, since the second piezoelectric vibration module 150 generates longitudinal vibration, the piezoelectric element 147C of the first piezoelectric vibration module 140 (FIG. 2) may be omitted. The piezoelectric driving device 400a of the second embodiment also has substantially the same effect as that of the piezoelectric driving device 400 of the first embodiment.

Figure 9:
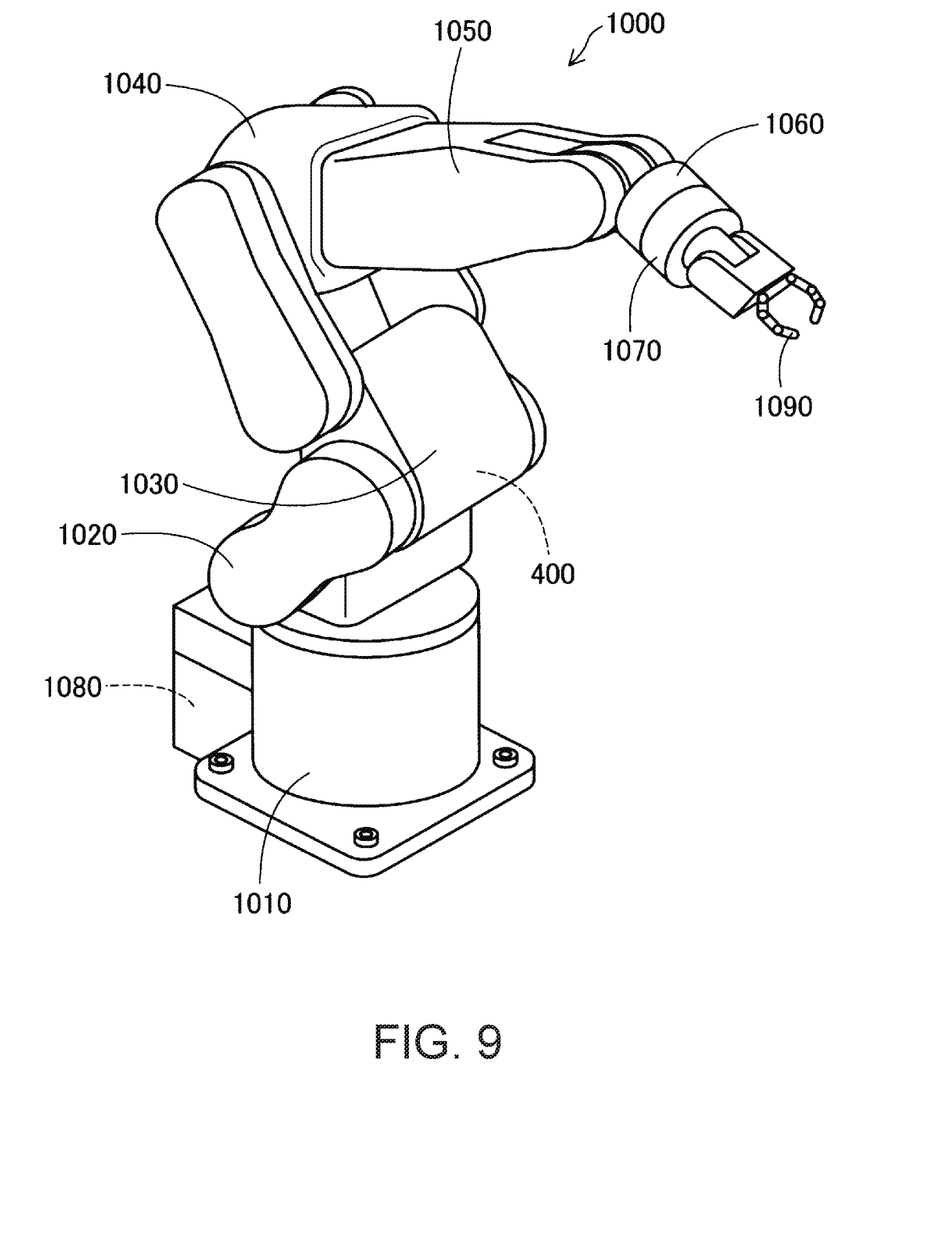
FIG. 9 is a perspective view illustrating a robot according to another embodiment.

FIG. 9 is a perspective view illustrating a robot according to another embodiment. A robot 1000 is a six-axis robot, and includes a base 1010 fixed to a floor or a ceiling, arms 1020, 1030, 1040, 1050, 1060, and 1070 which are rotatably linked to the base 1010, and a robot control portion 1080 for controlling the driving of the arms 1020, 1030, 1040, 1050, 1060, and 1070. In addition, a hand connecting portion is provided in the arm 1070, and an end effector 1090 that corresponds to work to be performed by the robot 1000 is attached in the hand connecting portion. In addition, the piezoelectric driving device 400 is mounted on all or a part of each joint portion, and each of the arms 1020, 1030, 1040, 1050, 1060, and 1070 rotates by the driving of the piezoelectric driving device 400. In addition, the driving of each of the piezoelectric driving devices 400 is controlled by the robot control portion 1080. Further, the piezoelectric driving device 400 may be mounted on the end effector 1090 and used to drive the end effector 1090. Since the robot 1000 is provided with the piezoelectric driving device 400, it is possible to achieve the effect of the above-described piezoelectric driving device 400.

In the above-described various embodiments, the configuration in which the piezoelectric driving device is applied to a robot has been described, but a piezoelectric driving device can be applied to various other apparatuses.

The entire disclosure of Japanese Patent Application No. 2017-146029, filed Jul. 28, 2017 is expressly incorporated by reference herein.

What is claimed is:

1. A piezoelectric driving device for driving a driven member, comprising:
   a piezoelectric vibrating body; and
   a driving circuit for electrically driving the piezoelectric vibrating body,
   wherein the piezoelectric vibrating body includes
      a contact which comes into contact with the driven member, and
      a piezoelectric element which generates vibration in accordance with a driving voltage supplied from the driving circuit, and
   wherein the driving circuit
      sets a driving frequency of the driving voltage to a first frequency and starts the driving at the time of initiation from a stopped state,
      sets a driving frequency of the driving voltage to a second frequency lower than the first frequency in a driving state after the initiation, and
      lowers the driving frequency to the second frequency by sweeping down the driving frequency from the first frequency, and
   wherein the driving circuit includes
      a voltage waveform generation circuit for generating a voltage waveform signal having a voltage waveform of the driving voltage, and
      a voltage amplification circuit for amplifying a voltage of the voltage waveform signal to generate the driving voltage, and
   wherein the voltage amplification circuit is configured such that a voltage amplification factor at the first frequency is higher than a voltage amplification factor at the second frequency.

2. The piezoelectric driving device according to claim 1, wherein a first resonance frequency of the piezoelectric vibrating body in the stopped state is higher than a second resonance frequency of the piezoelectric vibrating body in the driving state,
   wherein the first frequency is closer to the first resonance frequency than to the second resonance frequency, and
   wherein the second frequency is closer to the second resonance frequency than to the first resonance frequency.

3. The piezoelectric driving device according to claim 1, wherein the piezoelectric vibrating body is pressed against the driven member by a spring member.

4. The piezoelectric driving device according to claim 1, wherein the driving circuit sets a value of the driving voltage in the driving state to be lower than a value of the driving voltage in the initiation.

5. The piezoelectric driving device according to claim 1, wherein the voltage amplification circuit has a resonance frequency, and is configured such that the resonance frequency is higher than the first frequency.

6. A robot comprising:
the piezoelectric driving device according to claim 1.

7. A robot comprising:
the piezoelectric driving device according to claim 2.

8. A robot comprising:
the piezoelectric driving device according to claim 3.

9. A robot comprising:
the piezoelectric driving device according to claim 4.

10. A robot comprising:
the piezoelectric driving device according to claim 5.

11. A driving method of a piezoelectric driving device which includes a piezoelectric vibrating body including a contact which comes into contact with a driven member, and a piezoelectric element which generates vibration in accordance with a driving voltage, wherein the piezoelectric vibrating body is configured such that a first resonance frequency in a stopped state is higher than a second resonance frequency in a driving state, wherein a driving frequency of a driving voltage is set to a first frequency closer to the first resonance frequency than to the second resonance frequency and the driving is started at the time of initiation from the stopped state, wherein a driving frequency of the driving voltage is set to a second frequency closer to the second resonance frequency than to the first resonance frequency, in a driving state after the initiation, wherein the driving frequency is lowered to the second frequency by sweeping down the driving frequency from the first frequency, wherein a voltage waveform signal is generated having a voltage waveform of the driving voltage, wherein a voltage of the voltage waveform signal is amplified to generate the driving voltage, and wherein a voltage amplification factor at the first frequency is higher than a voltage amplification factor at the second frequency.

* * * * *